United States Patent
Shan

(10) Patent No.: US 10,789,905 B2
(45) Date of Patent: Sep. 29, 2020

(54) ARRAY SUBSTRATE AND DISPLAY PANEL

(71) Applicant: HKC Corporation Limited, Shenzhen, Guangdong (CN)

(72) Inventor: Jianfeng Shan, Shenzhen (CN)

(73) Assignee: HKC CORPORATION LIMITED, Shenzhen, Guangdong (CN)

(*) Notice: Subject to any disclaimer, the term of this patent is extended or adjusted under 35 U.S.C. 154(b) by 0 days.

(21) Appl. No.: 16/328,973

(22) PCT Filed: Oct. 31, 2018

(86) PCT No.: PCT/CN2018/112920
§ 371 (c)(1),
(2) Date: Feb. 27, 2019

(87) PCT Pub. No.: WO2019/169881
PCT Pub. Date: Sep. 12, 2019

(65) Prior Publication Data
US 2020/0013357 A1    Jan. 9, 2020

(30) Foreign Application Priority Data
Mar. 8, 2018  (CN) .......................... 2018 1 0190675

(51) Int. Cl.
*G09G 3/36* (2006.01)
*G02F 1/1333* (2006.01)
(Continued)

(52) U.S. Cl.
CPC ......... *G09G 3/3648* (2013.01); *G02F 1/1368* (2013.01); *G02F 1/133305* (2013.01);
(Continued)

(58) Field of Classification Search
CPC combination set(s) only.
See application file for complete search history.

(56) References Cited

U.S. PATENT DOCUMENTS

2013/0243149 A1    9/2013 Yamazaki
2016/0111452 A1    4/2016 Umezaki
(Continued)

FOREIGN PATENT DOCUMENTS

CN    103489422 A    1/2014
CN    104835450 A    8/2015
(Continued)

*Primary Examiner* — Deeprose Subedi
(74) *Attorney, Agent, or Firm* — Muncy, Geissler, Olds & Lowe, P.C.

(57) ABSTRACT

An array substrate and a display panel are provided. The array substrate includes: a substrate; an active switch; and a shift register circuit, located on a side edge of the substrate, and including a multistage shift register, including: a first switch, a second switch, a third switch, a fourth switch, and a fifth switch, where widths of first ends and second ends of the plurality of switches of the shift register are greater than widths of a first end and a second end of the active switch. In this application, the widths of the first ends and the second ends of the plurality of switches of the shift register may be increased to resolve problems of a poor electric property of a switch of a shift register circuit caused by a curvature change of a flexible display panel and bright and dark lines caused by the poor electric property.

15 Claims, 6 Drawing Sheets

(51) Int. Cl.
*G02F 1/1368* (2006.01)
*G11C 19/28* (2006.01)
*G02F 1/1362* (2006.01)
*H01L 27/12* (2006.01)

(52) U.S. Cl.
CPC .. *G11C 19/28* (2013.01); *G02F 2001/136222* (2013.01); *G09G 2310/0286* (2013.01); *H01L 27/1218* (2013.01)

(56) References Cited

U.S. PATENT DOCUMENTS

2018/0226039 A1\* 8/2018 Han ................... G09G 3/3648
2019/0244976 A1\* 8/2019 Zhu ................... H01L 27/1218

FOREIGN PATENT DOCUMENTS

| CN | 105448269 A | 3/2016 |
| CN | 105654991 A | 6/2016 |
| CN | 107146584 A | 9/2017 |
| CN | 108398837 A | 8/2018 |

\* cited by examiner

ARRAY SUBSTRATE AND DISPLAY PANEL

BACKGROUND

Technical Field

This application relates to a pixel circuit in the display field, and in particular, to an array substrate and a display panel.

Related Art

In recent years, with the progress of science and technologies, a flat panel liquid crystal display has been gradually popular, and has advantages such as being light and thin. Currently, a drive circuit of the flat panel liquid crystal display is mainly formed by externally connecting a chip to a panel, but this method neither can reduce product costs, nor can make the panel thinner.

A liquid crystal display device generally includes a gate drive circuit, a source drive circuit, and a pixel array. The pixel array includes a plurality of pixel circuits, and each pixel circuit is turned on and off according to a scanning signal provided by the gate drive circuit, and displays a data image according to a data signal provided by the source drive circuit. Using the gate drive circuit as an example, the gate drive circuit generally includes a multistage shift register, and outputs the scanning signal to the pixel array by delivering the scanning signal from one stage of the shift register to a next stage of the shift register, to sequentially turn on the pixel circuit, so that the pixel circuit receives the data signal.

Therefore, in a manufacture procedure of the drive circuit, the gate drive circuit is directly manufactured on an array substrate to replace a drive chip manufactured by externally connecting to an IC. Such application is referred to as a Gate On Array (GOA) technology and may be directly manufactured around the panel, to decrease manufacture processes, reduce product costs, and make the panel thinner.

Because of better appreciation effects and visual experience, a curved display panel is preferred by manufacturers in recent years. However, when the GOA technology is applied to the curved display panel, with the different degrees of the curvature of the display panel, an active switch element disposed in the display panel also deforms at different degrees, affecting the structure and performance of the display panel, and further causing differences in output of a GOA circuit. The product quality may be affected along with the phenomenon of bright and dark lines.

SUMMARY

To resolve the foregoing technical problem, the objective of this application is to provide an array substrate and a display panel.

The objective and the solution to the technical problem of this application are implemented by using the following technical solutions. An array substrate provided according to this application includes: a substrate; a plurality of active switches, disposed on the substrate; and a shift register circuit, disposed on the substrate, and located on a side edge of the substrate, where the shift register circuit includes a multistage shift register, and each stage of the shift register includes: a first switch, where a control end of the first switch is coupled to a first node, a first end is coupled to a frequency signal, and a second end is coupled to an output pulse signal; a second switch, where a control end and a first end of the second switch are coupled to an input pulse signal, and a second end is coupled to the first node; a third switch, where a control end of the third switch is coupled to a second node, a first end is coupled to the output pulse signal, and a second end is coupled to a low preset potential; and a fourth switch, where a control end of the fourth switch is coupled to the second node, a first end is coupled to the first node, and a second end is coupled to the low preset potential, where widths of the first ends and the second ends of the first switch, the second switch, the third switch, and the fourth switch are greater than widths of a first end and a second end of the active switch.

In an embodiment of this application, the shift register further includes a compensation circuit, including: a fifth switch, where a control end of the fifth switch is coupled to the output pulse signal, a first end is coupled to the output pulse signal, and a second end is coupled to the low preset potential.

In an embodiment of this application, widths of the first end and the second end of the fifth switch are greater than the widths of the first end and the second end of the active switch.

In an embodiment of this application, the widths of the first ends and the second ends of the first switch, the second switch, the third switch, the fourth switch, and the fifth switch are the same.

In an embodiment of this application, the compensation circuit reduces a potential difference between the control end and the first end of the fourth switch.

In an embodiment of this application, the shift register further includes a drop-down sub-circuit, coupled to the first node, the output pulse signal, and the low preset potential.

In an embodiment of this application, the shift register further includes a drop-down sub-circuit controller, coupled to the low preset potential and the drop-down sub-circuit.

The objective and the solution to the technical problem of this application may be further implemented by using the following technical measures.

Another objective of this application is to provide an array substrate, including: a substrate; a plurality of active switches, disposed on the substrate; and a shift register circuit, disposed on the substrate, and located on a side edge of the substrate, where the shift register circuit includes a multistage shift register, and each stage of the shift register includes: a first switch, where a control end of the first switch is coupled to a first node, a first end is coupled to a frequency signal, and a second end is coupled to an output pulse signal; a second switch, where a control end and a first end of the second switch are coupled to an input pulse signal, and a second end is coupled to the first node; a third switch, where a control end of the third switch is coupled to a second node, a first end is coupled to the output pulse signal, and a second end is coupled to a low preset potential; a fourth switch, where a control end of the fourth switch is coupled to the second node, a first end is coupled to the first node, and a second end is coupled to the low preset potential; and a fifth switch, where a control end of the fifth switch is coupled to the output pulse signal, a first end is coupled to the output pulse signal, and a second end is coupled to the low preset potential, where widths of the first ends and the second ends of the first switch, the second switch, the third switch, the fourth switch, and the fifth switch are the same, and the width of the first end of the first switch is greater than a width of a first end of the active switch; and the first ends and the second ends of the first switch, the second switch, the third switch, the fourth switch, and the fifth switch have equal projection areas on a horizontal plane.

Another objective of this application is to provide a display panel, including: a first substrate; and the array substrate as described above, disposed opposite to the first substrate. The first substrate and the array substrate are flexible substrates, and the flexible substrate enables the display panel to be a curved display panel.

In an embodiment of this application, for the display panel, the first ends and the second ends of the first switch, the second switch, the third switch, the fourth switch, and the fifth switch have larger widths when the first ends and the second ends are closer to a side edge of the array substrate.

In an embodiment of this application, the first ends and the second ends of the first switch, the second switch, the third switch, the fourth switch, and the fifth switch have equal projection areas on a horizontal plane.

In this application, the widths of the first ends and the second ends of the plurality of switches of the shift register may be increased to resolve problems of a poor electric property of a switch of a shift register circuit caused by a curvature change of a flexible display panel and bright and dark lines caused by the poor electric property.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface", merely refer to directions in the accompanying drawings. Therefore, the used terms about directions are used to describe and understand this application, and are not intended to limit this application.

The accompanying drawings and the description are considered to be essentially exemplary, rather than limitative. In the figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, a region, and the like are enlarged. In the accompanying drawings, for understanding and ease of description, thicknesses of some layers and regions are enlarged. It should be understood that when a component such as a layer, a film, a region, or a base is referred to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout this specification, "on" means that one is located above or below a target component and does not necessarily mean that one is located on the top based on a gravity direction.

To further describe the technical measures taken in this application to achieve the intended application objectives and effects thereof, specific implementations, structures, features, and effects of an array substrate and a display panel provided according to this application are explained below in detail with reference to the accompanying drawings and preferred embodiments.

Figure 1A:
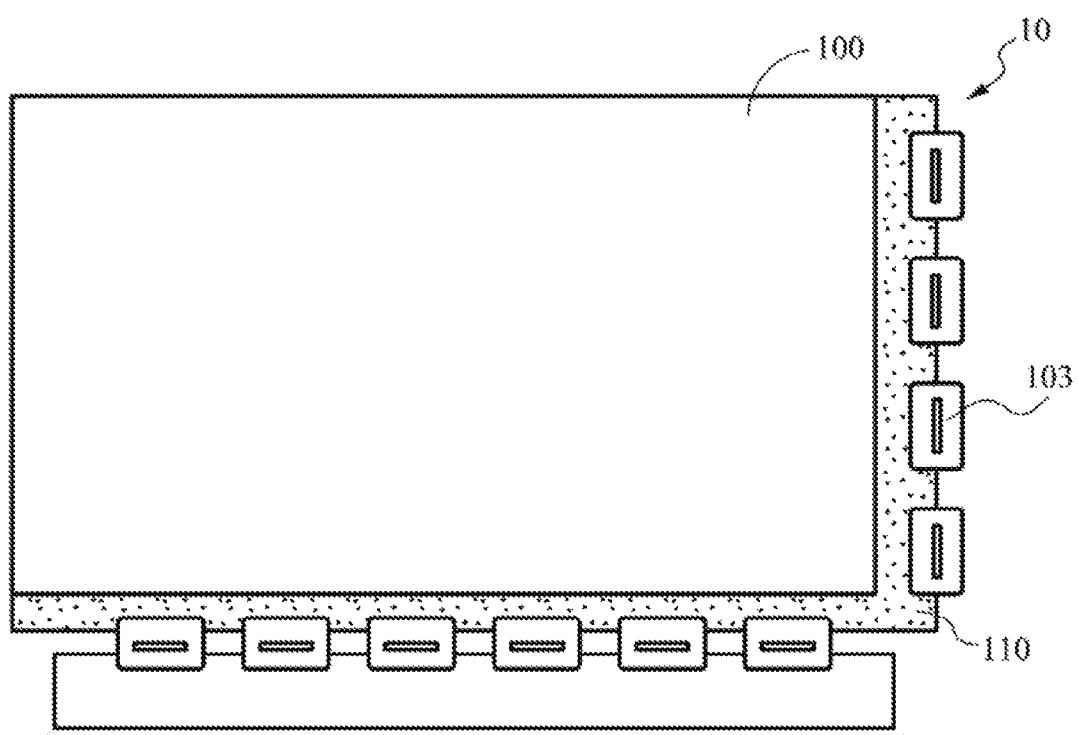
FIG. 1a is a schematic diagram of an exemplary display apparatus.

FIG. 1a is a schematic diagram of an exemplary display apparatus. Referring to FIG. 1a, a display apparatus 10 includes a color filter substrate 100, an active array substrate 110, and a drive chip 103, used to drive a circuit.

Figure 1B:
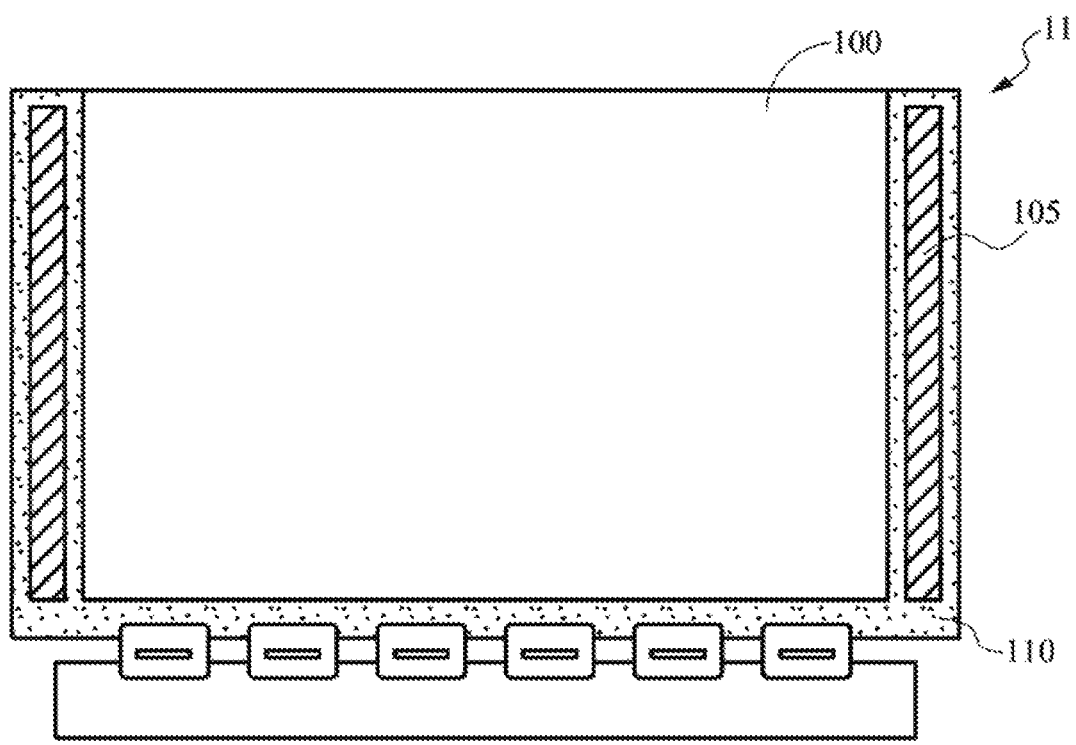
FIG. 1b is a schematic diagram of another exemplary display apparatus.

FIG. 1b is a schematic diagram of another exemplary display apparatus. Referring to FIG. 1b, in an embodiment of this application, a display apparatus 11 having a Gate on Array (GOA) includes a color filter substrate 100, an active array substrate 110, and a GOA 105, used to manufacture a gate drive circuit on the array substrate 110.

Figure 2A:
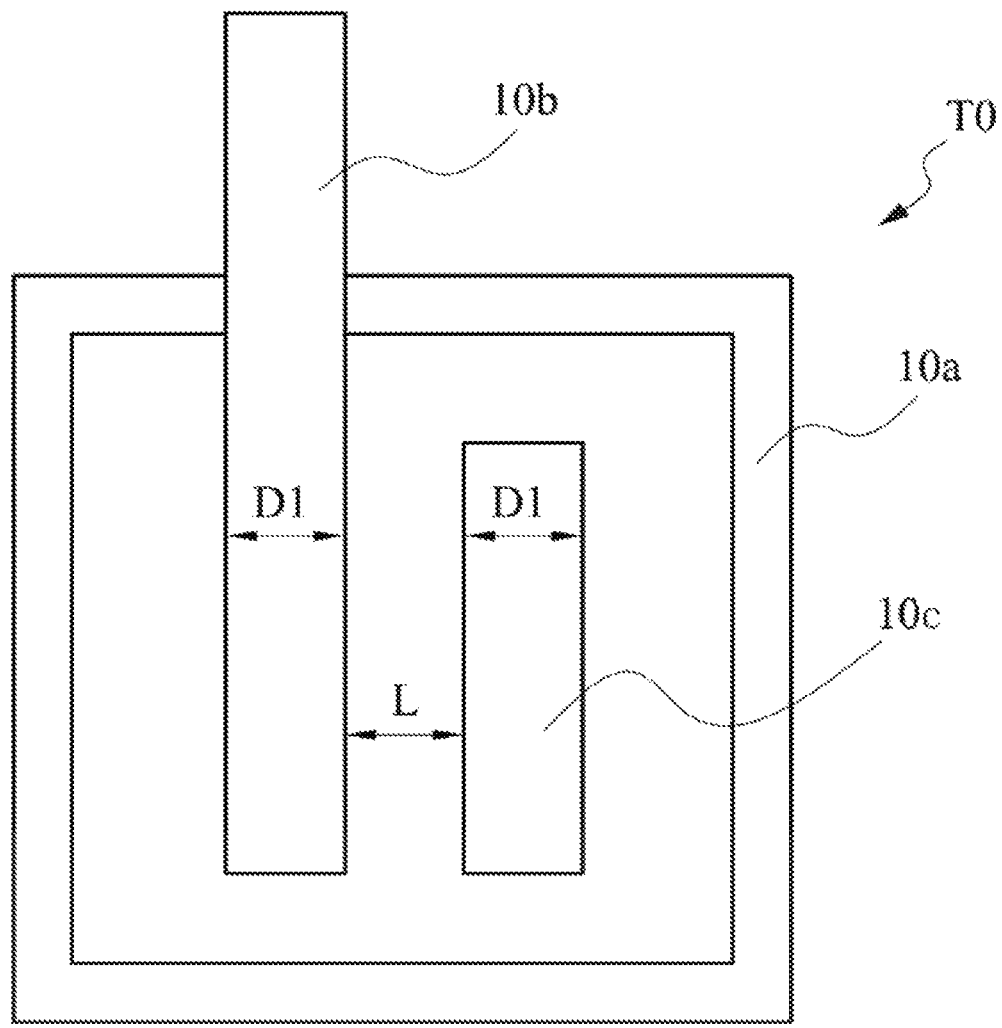
FIG. 2a to FIG. 2b are schematic diagrams of an exemplary active switch structure.
Figure 2B:
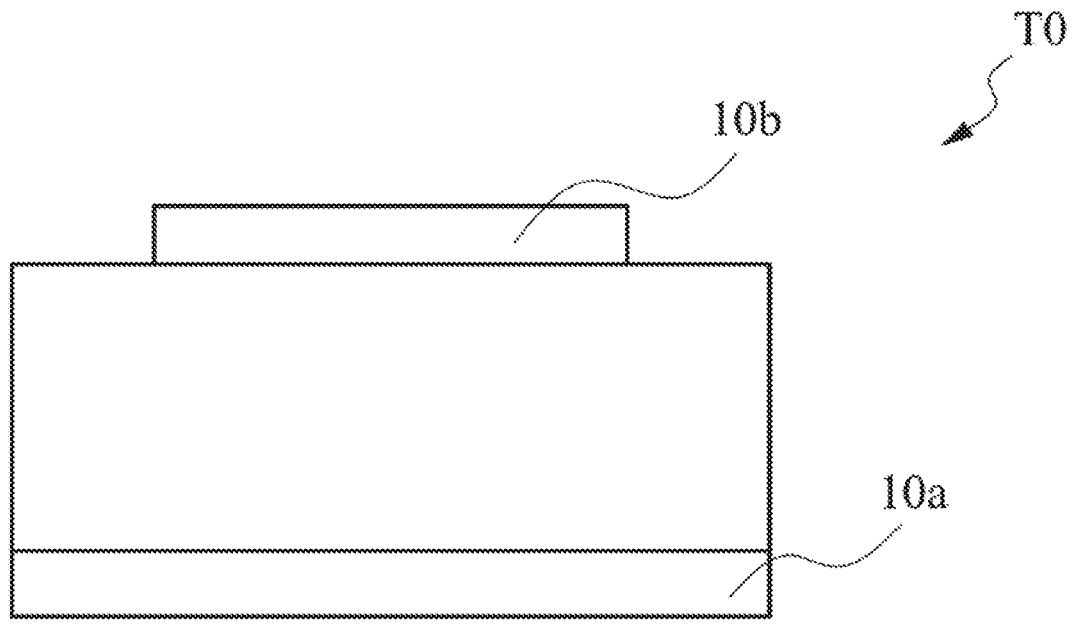
Figure 2C:
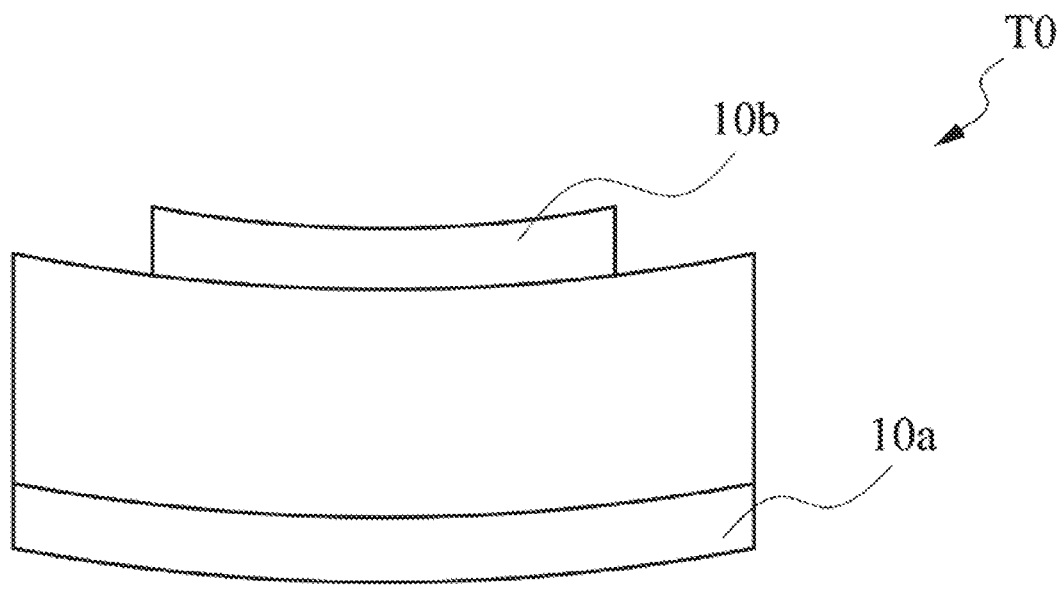
FIG. 2c is a schematic diagram of an exemplary active switch structure on a curved display panel.

FIG. 2a to FIG. 2b are schematic diagrams of an exemplary active switch structure, and FIG. 2c is a schematic diagram of an exemplary active switch structure on a curved display panel. Referring to FIG. 1b, FIG. 2a, FIG. 2b, and FIG. 2c, when the display apparatus having the GOA is applied to a curved display apparatus, compared with a flat panel display apparatus, it is most likely that a structure of an active switch T0 located on an edge side changes due to a curvature change of the edge side of the curved display panel. As shown in FIG. 2c, a control end 10a, a first end 10b, and a second end 20c of the active switch T0 deform due to the curvature change of the display panel, and widths D1 of the first end and the second end of the active switch change due to the curvature change, affecting the structure and performance of the active switch T0. Correspondingly, an electric property thereof also causes a difference at different degrees with the curvature change of the display pane, further causing an output difference, along with a phenomenon such as bright and dark lines or color cast.

Figure 3:
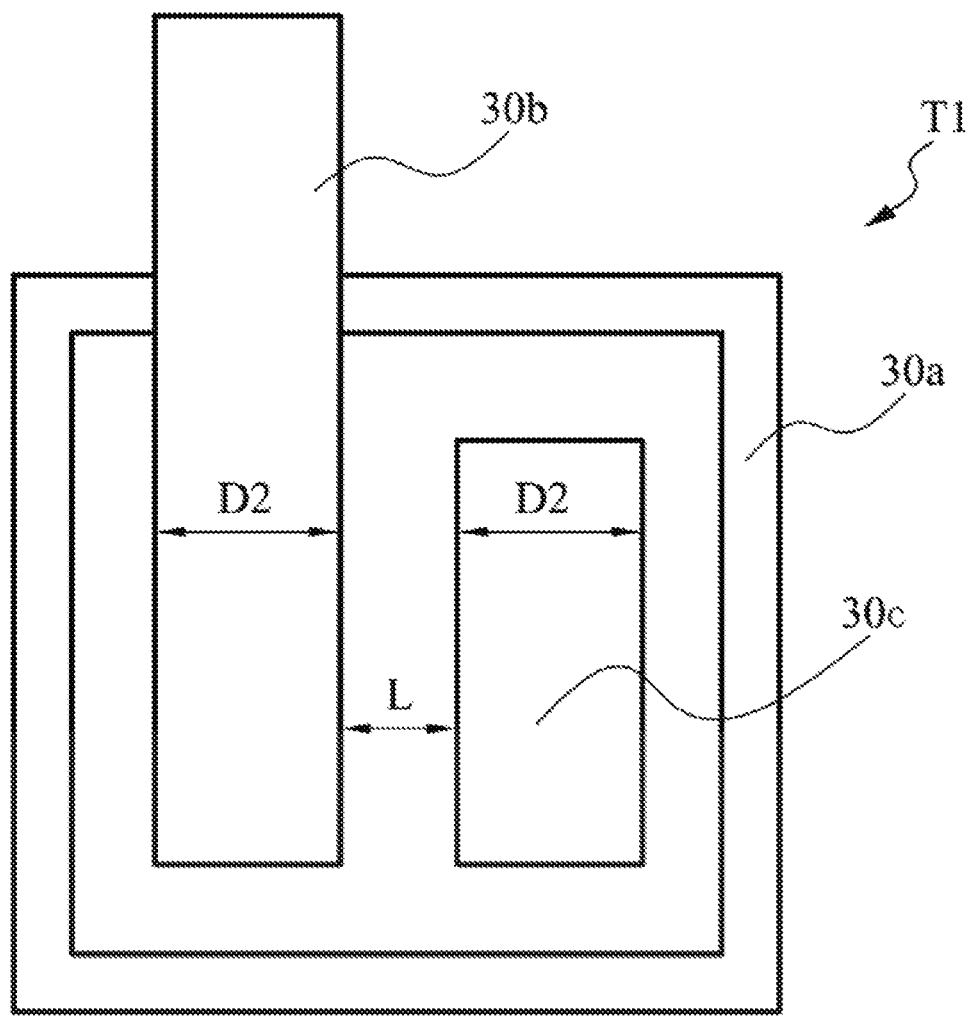
FIG. 3 is a schematic diagram of an active switch structure according to an embodiment of this application.
Figure 4:
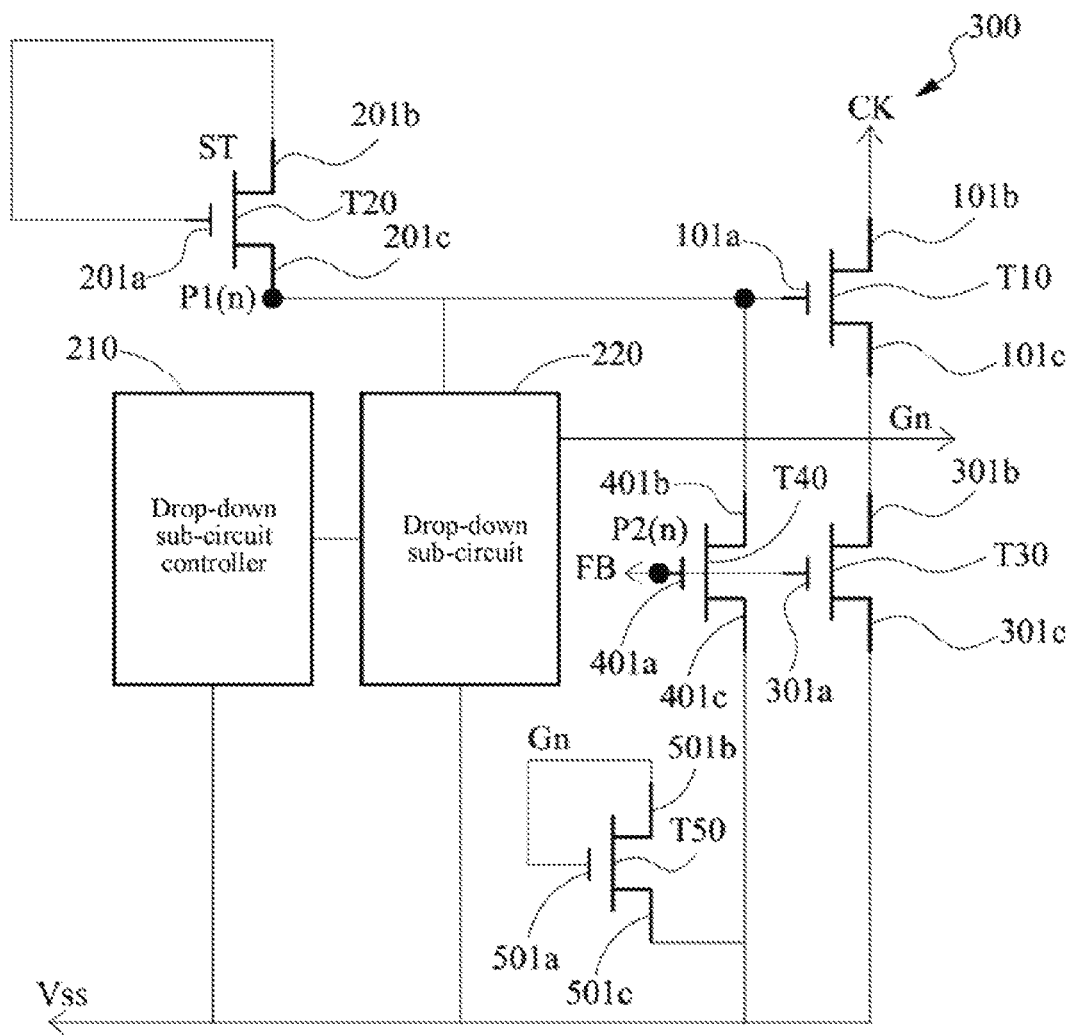
FIG. 4 is a schematic diagram of a pixel circuit according to an embodiment of this application.

FIG. 3 is a schematic diagram of an active switch structure according to an embodiment of this application, and FIG. 4 is a schematic diagram of an array substrate according to an embodiment of this application. Referring to FIG. 3 and FIG. 4, in an embodiment of this application, an array substrate includes: a substrate (not shown); a plurality of active switches (not shown), disposed on the substrate; and a shift register circuit 300, disposed on the substrate, and located on a side edge of the active switch, where the shift register circuit 300 includes a multistage shift register, and each stage of the shift register includes: a first switch T10, where a control end 101a of the first switch T10 is coupled to a first node P1(n), a first end 101b of the first switch T10 is coupled to a frequency signal CK, and a second end 101c of the first switch T10 is coupled to an output pulse signal Gn; a second switch T20, where a control end 201a of the second switch T20 is coupled to an input pulse signal ST, a first end 201b of the second switch T20 is coupled to the input pulse signal ST, and a second end 201c of the second switch T20 is coupled to the first node P1(n); a third switch T30, where a control end 301a of the third switch T30 is coupled to a second node P2(n), a first end 301b of the third switch T30 is coupled to the output pulse signal Gn, and a second end 301c of the third switch T30 is coupled to a low preset potential Vss; and a fourth switch T40, where a control end 401a of the fourth switch T40 is coupled to the second node P2(n), a first end 401b of the fourth switch T40 is coupled to the first node P1(n), and a second end 401c of the fourth switch T40 is coupled to the low preset potential Vss, where widths D2 of the first ends and the second ends of the first switch T10, the second switch T20, the third switch T30, and the fourth switch T40 are greater than widths D1 of a first end and a second end of the active switch.

In an embodiment of this application, a compensation circuit is further included, and includes: a fifth switch T50, where a control end 501a of the fifth switch T50 is coupled to the output pulse signal Gn, a first end 501b of the fifth switch T50 is coupled to the output pulse signal Gn, and a second end of the fifth switch T50 is coupled to the low preset potential.

In an embodiment of this application, widths D2 of the first end and the second end of the fifth switch T50 are greater than the widths D1 of the first end and the second end of the active switch.

In an embodiment of this application, the compensation circuit is used to reduce a potential difference between the control end 401a and the first end 401b of the fourth switch T40.

In an embodiment of this application, a drop-down sub-circuit 220 is further included, and is coupled to the first node P1(n), the output pulse signal Gn, and the low preset potential Vss.

In an embodiment of this application, a drop-down sub-circuit controller 210 is further included, and is coupled to the low preset potential Vss and the drop-down sub-circuit.

Referring to FIG. 3, a switch T1 is used as an example of T10, T20, T30, T40, and T50, a distance between a first end 30b and a second end 30c of the switch T1 is L, and a width of the switch T1 is D2 and is greater than the widths of the first end and the second end of the active switch. In the curved display panel, by increasing the widths D2 of the first end 30b and the second end 30c of the switch T1, projection areas of the first end 30b and the second end 30c on the control end 30a are the same as or similar to the widths of the first end and the second end of the active switch, and even greater than a width of the active switch, so that the switch T1 can maintain desirable electrical performance, to prevent a disordered shift register circuit and generation of the problem of bright and dark lines caused by poor electric performance.

Referring to FIG. 3 and FIG. 4, in an embodiment of this application, a display panel includes a first substrate, and the array substrate as described above, disposed opposite to the first substrate. The first substrate and the array substrate are flexible substrates.

In an embodiment of this application, the first ends and the second ends of the first switch T10, the second switch T20, the third switch T30, the fourth switch T40, and the fifth switch T50 have larger widths D2 when the first ends and the second ends are closer to a side edge of the array substrate.

In an embodiment of this application, the widths D2 of the first ends and the second ends of the first switch T10, the second switch T20, the third switch T30, the fourth switch T40, and the fifth switch T50 have equal projection areas on a horizontal plane.

In some embodiments, the display panel of this application may be, for example, a liquid crystal display panel, such as a vertical alignment (VA) display panel, which may include an array (Thin Film Transistor, TFT) substrate, a color filter (CF) substrate, and a liquid crystal layer formed between the two substrates. In an embodiment, an active array (TFT) and a CF of this application may be formed on a same substrate.

In some embodiments, the display panel of this application is a curved display panel.

In some embodiments, by increasing the widths D2 of the first ends and the second ends of the switches of the shift register circuit 300, the shift register circuit 300 may be on the curved display panel, to overcome a poor electric property caused by a sudden curvature change of a panel edge, and improve the display effect and the panel quality.

In some embodiments, the display panel of this application may be, for example, a twisted nematic (TN) display panel, a super twisted nematic (STN) display panel, an optically compensated birefringence (OCB) display panel, an organic light emitting diode (OLED) display panel, or a plasma display panel.

In this application, the widths D2 of the first ends and the second ends of the switches (T10, T20, T30, T40, and T50) of the shift register circuit may be increased, and the switches on the display panel in different curvature ranges may also be designed with different widths, to resolve the problems of a poor electric property of a switch caused by a curvature change of a flexible display panel, and bright and dark lines caused by the poor electric property.

The wordings such as "in some embodiments" and "in various embodiments" are repeatedly used. The wordings usually refer to different embodiments, but they may also refer to a same embodiment. The wordings, such as "comprise", "have" and "include", are synonyms, unless other meanings are indicated in the context thereof.

The foregoing descriptions are merely embodiments of this application, and are not intended to limit this application in any form. Although this application has been disclosed above through the specific embodiments, the embodiments are not intended to limit this application. Any person skilled in the art can make some variations or modifications, which are equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. An array substrate, comprising:
   a plurality of active switches, disposed on the substrate, wherein the active switches are thin film transistors of the array substrate; and
   a shift register circuit, disposed on the substrate, and located on a side edge of the substrate, wherein the shift register circuit comprises a multistage shift register, and each stage of the multi stage shift register comprises:
   a first switch, wherein a control end of the first switch is coupled to a first node, a first end of the first switch is coupled to a frequency signal, and a second end of the first switch is coupled to an output pulse signal;
   a second switch, wherein a control end and a first end of the second switch are coupled to an input pulse signal, and a second end of the second switch is coupled to the first node;
   a third switch, wherein a control end of the third switch is coupled to a second node, a first end of the third switch is coupled to the output pulse signal, and a second end of the third switch is coupled to a low preset potential; and a fourth switch, wherein a control end of the fourth switch is coupled to the second node, a first end of the fourth switch is coupled to the first node, and a second end of the fourth switch is coupled to the low preset potential; and a compensation circuit, comprising a fifth switch, wherein a control end of the fifth switch is coupled to the output pulse signal, a first end of the fifth switch is coupled to the output pulse signal, and a second end of the fifth switch is coupled to the low preset potential, wherein widths of the first ends and the second ends of the first switch, the second switch, the third switch, and the fourth switch are greater than widths of a first end and a second end of the active switch;

the first ends and the second ends of the first switch, the second switch, the third switch, the fourth switch, and the fifth switch have equal projection areas on a horizontal plane; and the array substrate is flexible substrate;

whereby the widths of the first ends and the second ends of the first switch, the second switch, the third switch, the fourth switch, and the fifth switch can be increased, and the first ends and the second ends of the first switch, the second switch, the third switch, the fourth switch, and the fifth switch on a flexible display panel in different curvature ranges can also be designed with different widths.

2. The array substrate according to claim 1, wherein widths of the first end and the second end of the fifth switch are greater than the widths of the first end and the second end of the active switch.

3. The array substrate according to claim 1, wherein the widths of the first ends and the second ends of the first switch, the second switch, the third switch, the fourth switch, and the fifth switch are the same.

4. The array substrate according to claim 1, wherein the compensation circuit reduces a potential difference between the control end and the first end of the fourth switch.

5. The array substrate according to claim 1, wherein the shift register further comprises a drop-down sub-circuit, coupled to the first node, the output pulse signal, and the low preset potential.

6. The array substrate according to claim 5, wherein the shift register further comprises a drop-down sub-circuit controller, coupled to the low preset potential and the drop-down sub-circuit.

7. An array substrate, comprising:
a substrate;
a plurality of active switches, disposed on the substrate, wherein the active switches are thin film transistors of the array substrate; and
a shift register circuit, disposed on the substrate, and located on a side edge of the substrate, wherein the shift register circuit comprises a multistage shift register, and each stage of the shift register comprises:
a first switch, wherein a control end of the first switch is coupled to a first node, a first end of the first switch is coupled to a frequency signal, and a second end of the first switch is coupled to an output pulse signal;
a second switch, wherein a control end and a first end of the second switch are coupled to an input pulse signal, and a second end of the second switch is coupled to the first node;

a third switch, wherein a control end of the third switch is coupled to a second node, a first end of the third switch is coupled to the output pulse signal, and a second end of the third switch is coupled to a low preset potential;

a fourth switch, wherein a control end of the fourth switch is coupled to the second node, a first end of the fourth switch is coupled to the first node, and a second end of the fourth switch is coupled to the low preset potential; and a compensation circuit, comprising a fifth switch, wherein a control end of the fifth switch is coupled to the output pulse signal, a first end of the fifth switch is coupled to the output pulse signal, and a second end of the fifth switch is coupled to the low preset potential, wherein widths of the first ends and the second ends of the first switch, the second switch, the third switch, the fourth switch, and the fifth switch are the same, and the width of the first end of the first switch is greater than a width of a first end of the active switch;

the first ends and the second ends of the first switch, the second switch, the third switch, the fourth switch, and the fifth switch have equal projection areas on a horizontal plane; and the array substrate is flexible substrate;

whereby the widths of the first ends and the second ends of the first switch, the second switch, the third switch, the fourth switch, and the fifth switch can be increased, and the first ends and the second ends of the first switch, the second switch, the third switch, the fourth switch, and the fifth switch on a flexible display panel in different curvature ranges can also be designed with different widths.

8. A display panel, comprising:
a first substrate; and
an array substrate, disposed opposite to the first substrate, wherein the array substrate comprises:
a substrate;
a plurality of active switches, disposed on the substrate, wherein the active switches are thin film transistors of the array substrate; and
a shift register circuit, disposed on the substrate, and located on a side edge of the substrate, wherein the shift register circuit comprises a multistage shift register, and each stage of the shift register comprises:
a first switch, wherein a control end of the first switch is coupled to a first node, a first end of the first switch is coupled to a frequency signal, and a second end of the first switch is coupled to an output pulse signal;
a second switch, wherein a control end and a first end of the second switch are coupled to an input pulse signal, and a second end of the second switch is coupled to the first node;
a third switch, wherein a control end of the third switch is coupled to a second node, a first end of the third switch is coupled to the output pulse signal, and a second end of the third switch is coupled to a low preset potential; and
a fourth switch, wherein a control end of the fourth switch is coupled to the second node, a first end of the fourth switch is coupled to the first node, and a second end of the fourth switch is coupled to the low preset potential; and
a compensation circuit, comprising a fifth switch, wherein a control end of the fifth switch is coupled to the output pulse signal, a first end of the fifth switch is coupled to the output pulse signal, and a second end of the fifth switch is coupled to the low preset potential, wherein widths of the first ends and the second ends of the first switch, the second switch, the third switch, and the fourth switch are greater than widths of a first end and a second end of the active switch;

the first ends and the second ends of the first switch, the second switch, the third switch, the fourth switch, and the fifth switch have equal projection areas on a horizontal plane; and the first substrate and the array substrate are flexible substrates;

whereby the widths of the first ends and the second ends of the first switch, the second switch, the third switch, the fourth switch, and the fifth switch can be increased, and the first ends and the second ends of the first switch, the second switch, the third switch, the fourth switch, and the fifth switch on a flexible display panel in different curvature ranges can also be designed with different widths.

9. The display panel according to claim 8, wherein the first ends and the second ends of the first switch, the second switch, the third switch, the fourth switch, and the fifth switch have larger widths when the first ends and the second ends are closer to a side edge of the array substrate.

10. The display panel according to claim 9, wherein the first ends and the second ends of the first switch, the second switch, the third switch, the fourth switch, and the fifth switch have equal projection areas on a horizontal plane.

11. The array substrate according to claim 8, wherein widths of the first end and the second end of the fifth switch are greater than the widths of the first end and the second end of the active switch.

12. The array substrate according to claim 8, wherein the widths of the first ends and the second ends of the first switch, the second switch, the third switch, the fourth switch, and the fifth switch are the same.

13. The array substrate according to claim 8, wherein the compensation circuit reduces a potential difference between the control end and the first end of the fourth switch.

14. The array substrate according to claim 8, wherein the shift register further comprises a drop-down sub-circuit, coupled to the first node, the output pulse signal, and the low preset potential.

15. The array substrate according to claim 14, wherein the shift register further comprises a drop-down sub-circuit controller, coupled to the low preset potential and the drop-down sub-circuit.

* * * * *